United States Patent [19]
Ellis et al.

[11] Patent Number: 5,440,592
[45] Date of Patent: Aug. 8, 1995

[54] METHOD AND APPARATUS FOR MEASURING FREQUENCY AND HIGH/LOW TIME OF A DIGITAL SIGNAL

[75] Inventors: David Ellis, Hillsboro; Gary Brady, Aloha, both of Oreg.

[73] Assignee: Intel Corporation, Santa Clara, Calif.

[21] Appl. No.: 40,623

[22] Filed: Mar. 31, 1993

[51] Int. Cl.$^6$ .............................................. H04L 7/00
[52] U.S. Cl. .................................. 375/354; 370/357; 307/409; 327/39; 327/49
[58] Field of Search ............... 375/106, 110, 111, 113, 375/118-119; 370/100.1, 108; 377/54, 64, 67; 307/409-411, 510, 269, 231; 328/55, 56, 63

[56] References Cited

U.S. PATENT DOCUMENTS

| | | | |
|---|---|---|---|
| 4,922,438 | 5/1990 | Ballweg | 375/118 |
| 4,931,986 | 6/1990 | Daniel et al. | 328/55 |
| 4,999,526 | 3/1991 | Dudley | 307/269 |
| 5,159,278 | 10/1992 | Mattison | 328/63 |

Primary Examiner—Stephen Chin
Assistant Examiner—Young Tse
Attorney, Agent, or Firm—Blakely, Sokoloff, Taylor & Zafman

[57] ABSTRACT

A delay chain having a known number of delay elements providing various delayed outputs of its input, a first and a second register set, and preferably, an array of multiplexors, are provided to measure the frequency of a digital signal, and the high and low time of its period. The digital signal to be measured is provided to the delay chain as input. A first and a second sample of the various delayed outputs are taken at the beginning and the end of a known time period, and stored in the first and second registers, one delayed output per register bit. The sample results stored in the register sets are read out through the multiplexors, and used to determine the frequency of the digital signal being measured, and the high and low time of its period.

12 Claims, 19 Drawing Sheets

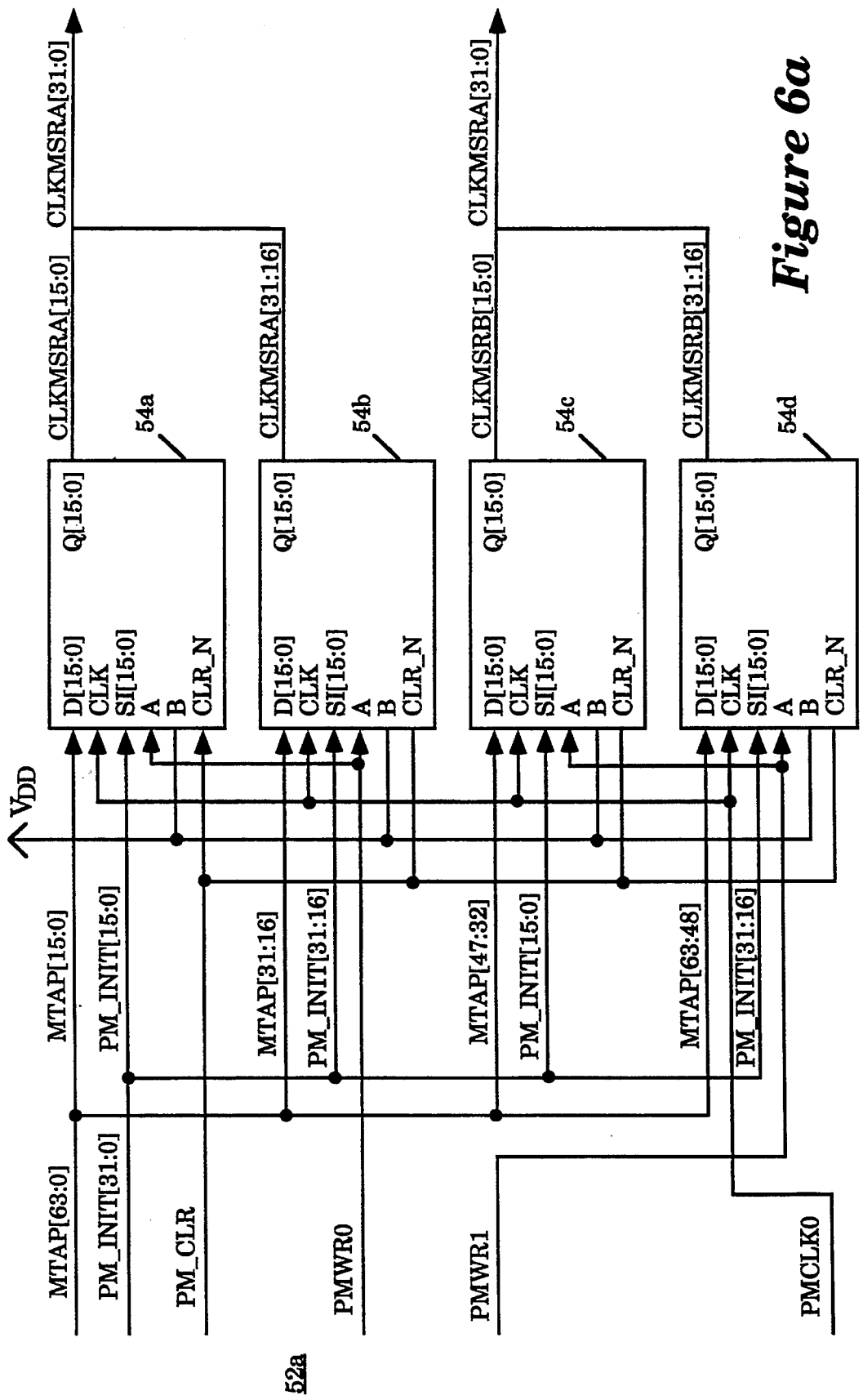

METHOD AND APPARATUS FOR MEASURING FREQUENCY AND HIGH/LOW TIME OF A DIGITAL SIGNAL

BACKGROUND OF THE INVENTION

1. Field of the Invention

The present invention relates to the field of high speed digital circuits, in particular, high speed digital circuits based on CMOS technology. More specifically, the present invention relates to a method and apparatus for measuring frequency and high/low time of a digital signal for high speed digital circuits in a digital system, such as a data instrumentation system.

2. Background

In a number of digital applications, it is often necessary to determine whether the frequency of a digital signal is symmetric to another digital signal, i.e. same number of pulses, and whether the period of the digital signal is 50% duty cycle symmetric, i.e. high and low time are equal. A particular example is when digital clock skew is digitally compensated within a high speed digital circuit by reconstructing the digital clock, as the digital clock passes from one high speed digital circuit to another. More specifically, when the reconstructed digital clock is generated by a flip flop using the entering digital clock, a constant high enable and a clear signal.

Under this approach, the reconstructed digital clock is generated by clocking the constant high enable into the flip flop at the rising clock edge of a clock period. Concurrently, the constant high enable and its complement are clocked out of the flip flop. The complement output, after having been properly delayed, is used to assert an active low at the clear input of the flip flop for clearing its content as well as it outputs, which in turn causes the active low to be deasserted. As the process continues, the reconstructed digital clock is generated. However, if the active low is not deasserted before the rising clock edge of the next clock period, the reconstructed digital clock will have at most half of the frequency of the entering digital clock. Furthermore, the clock period of the reconstructed clock will not be 50% duty cycle symmetric. In one approach, a known calibration clock is used to calibrate the circuit and ensure the active low is asserted and deasserted at the right time.

Thus, it is desirable to be able to measure and determine the frequency of the reconstructed clock, and the high and low time of the reconstructed clock period. As will be disclosed, the present invention provides such a method and apparatus, which advantageously achieves the desirable results. As will be obvious from the descriptions to follow, the present invention has particular application to high speed data instrumentation systems.

SUMMARY OF THE INVENTION

Under the present invention, the desirable results are advantageously achieved by providing a delay chain having a known number of delay elements providing various delayed outputs of an input digital signal, a first and a second register set, and preferably, an array of multiplexors. The digital signal to be measured is provided to the delay chain as input. A first and a second sample of the various delayed outputs are taken at the beginning and the end of a known time period, and stored in the first and second register sets, one delayed output per register bit. The sample results stored in the register sets are read out through the multiplexors, and used to determine the frequency of the digital signal being measured, and the high and low time of its period.

BRIEF DESCRIPTION OF THE DRAWINGS

The objects, features, and advantages of the present invention will be apparent from the following detailed description of the presently preferred and alternate embodiments of the invention with references to the drawings in which:

FIGS. 6a-6b illustrate one embodiment of the register sets of FIG. 4 in further detail.

DETAILED DESCRIPTION PRESENTLY PREFERRED AND ALTERNATE EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
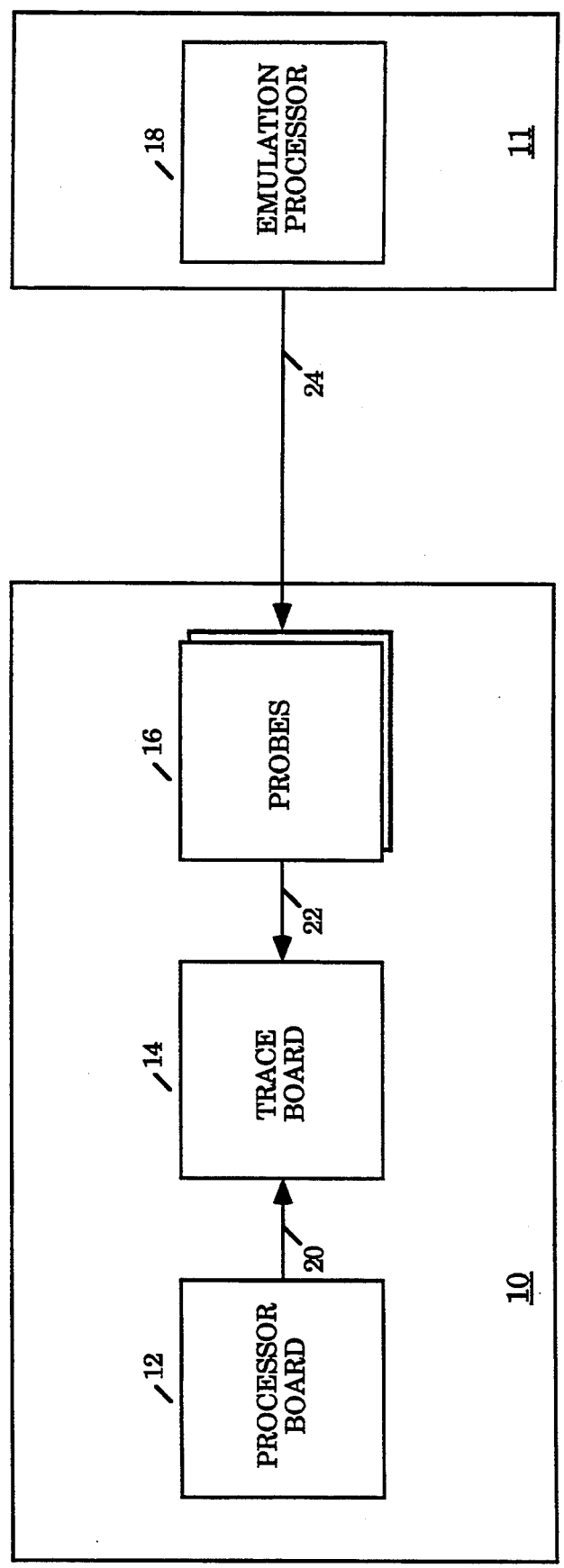
FIG. 1 illustrates an exemplary high speed data instrumentation system incorporated with the teachings of the present invention.

Referring now to FIG. 1, a block diagram illustrating an exemplary data instrumentation system incorporated with the teachings of the present invention is shown. Shown is an exemplary data instrumentation system 10 incorporated with the teachings of the present invention coupled to a target system 11 for monitoring, acquiring data, and controlling the target system 11. Depending on the target system 11, the data instrumentation system 10 may be operated with different operating speed at different times. The exemplary data instrumentation system 10 comprises a processor board 12, a trace board 14 incorporated with the teachings of the present invention, and a number of probes 16, while the target system 11 comprises an emulation processor 18. The processor board 12 is coupled to the trace board 14, for example, through a parallel bus 20. The trace board 14 is coupled to the probes 16, for example, through a number of parallel cables 22. The probes 16 are in turn coupled to the emulation processor 18. The trace board 14 will be described below in further detail with additional references to the remaining figures. The processor board 12, the probes 16 and the emulation processor 18 are intended to represent a broad category of these elements found in many data instrumentation and target systems.

Their constitutions and functions are well known and will not be further described.

Figure 2:
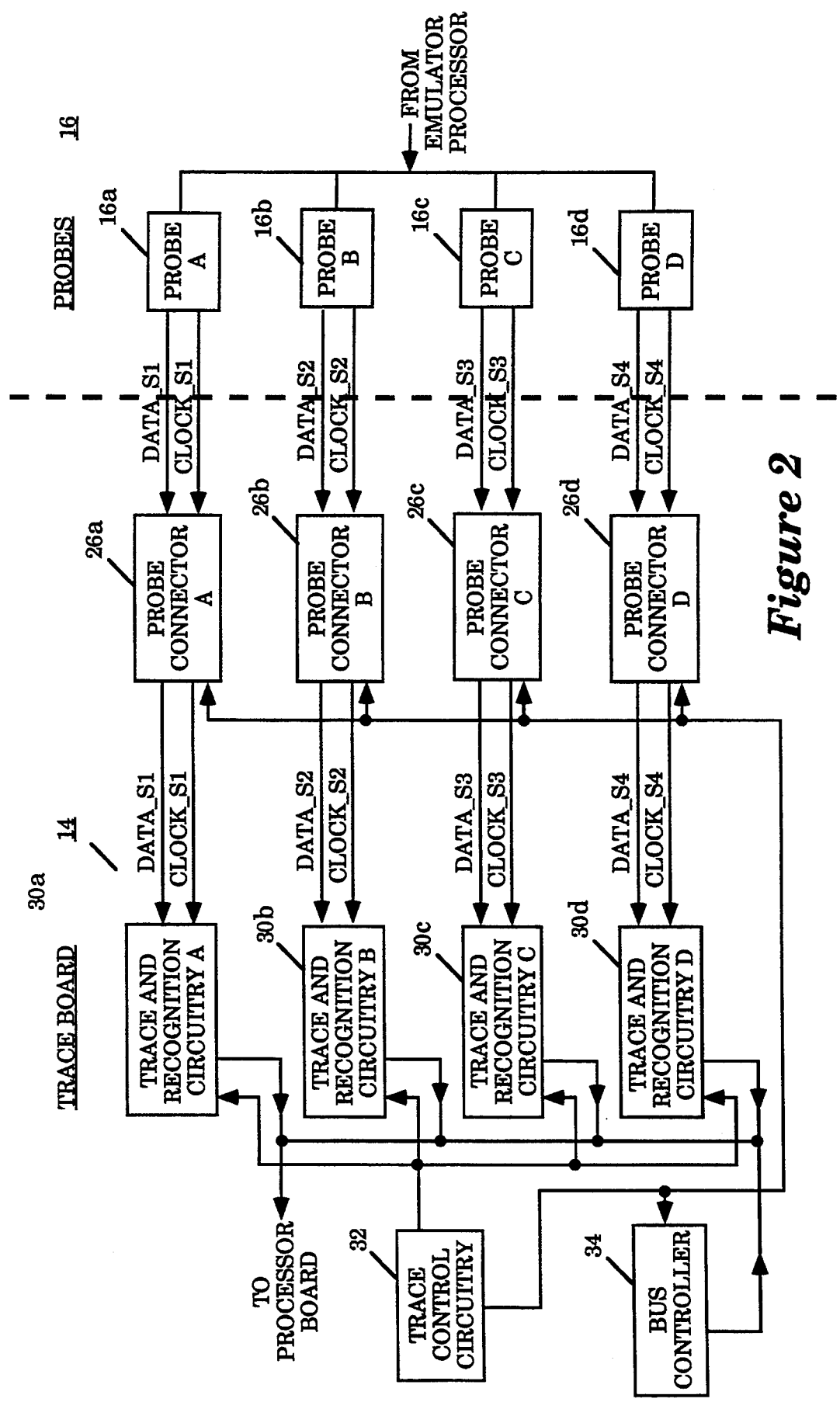
FIG. 2 illustrates the trace board of FIG. 1 in further detail.

Referring now to FIG. 2, a block diagram illustrating the trace board of FIG. 1 in further detail is shown. The trace board 14 comprises a plurality of high speed trace and recognition circuitry (TAR) 30a14 30d incorporated with the teachings of the present invention, a number of probe connectors 26a–26d, a bus controller 34, and trace control circuitry 32. The probe connectors 26a–26d, the bus controller 34, and the trace control circuitry 32 are all coupled to the high speed TARs 30a–30d. The probe connectors 26a–26d are also coupled to the bus controller 34 and the trace control circuitry 32. Each of the high speed TARs 30a–30d receives probe data along with its own digital clock from a probe 16a–16d through its corresponding probe connector 26a–26d. The digital clocks are skewed as they travel from the probes 16a–16d to the TARs 30a–30d. While each of the high speed TARs 30a–30d may operate at different operating speed for different target systems, its components do require a minimum amount of high and low time in each of the clock period of the digital clock it receives along with the probe data. Thus, each high speed TAR 30a–30d is provided with digital clock reconstruction and related circuitry for compensating the entering clock's skew, and ensuring the required amount of high and low time is provided. In particular, each high speed TAR 30a–30d is provided with the frequency and high/low time measuring circuit of the present invention, which will be described in further detail below with references to FIGS. 4–9. The digital clock reconstruction and other related circuitry provided to each of the high speed TARs 30a–30d will be briefly described with references to FIG. 3. Otherwise, the high speed TARs 30a–30d, the probe connectors 26a–26d, the bus controller 34, and the trace control circuitry 32 are intended to represent a broad category of these elements found in many trace boards, including but not limited to the trace boards described in copending U.S. patent applications, Ser. No. 08/040,902, filed Mar. 31, 1993, entitled Method and Apparatus For Resynchronizing Data Slices With Variable Skews, and Ser. No. 08/040,901, filed Mar. 31, 1993 entitled Method and Apparatus For Synchronizing Periodic Sync Pulse Generations By A Number Of Remote High Speed Circuits, both assigned to assignee of the present invention, which are hereby fully incorporated by reference. Their constitutions and functions will not be further described.

While the present invention is being described with high speed TARs of a trace board of a data instrumentation system, based on the description to follow, it will be appreciated that the present invention may be practiced with other high speed digital circuits on the data instrumentation system. In fact, the present invention may be practiced with other digital systems comprising high speed circuit, such as a high speed microprocessor based computer system.

Figure 3:
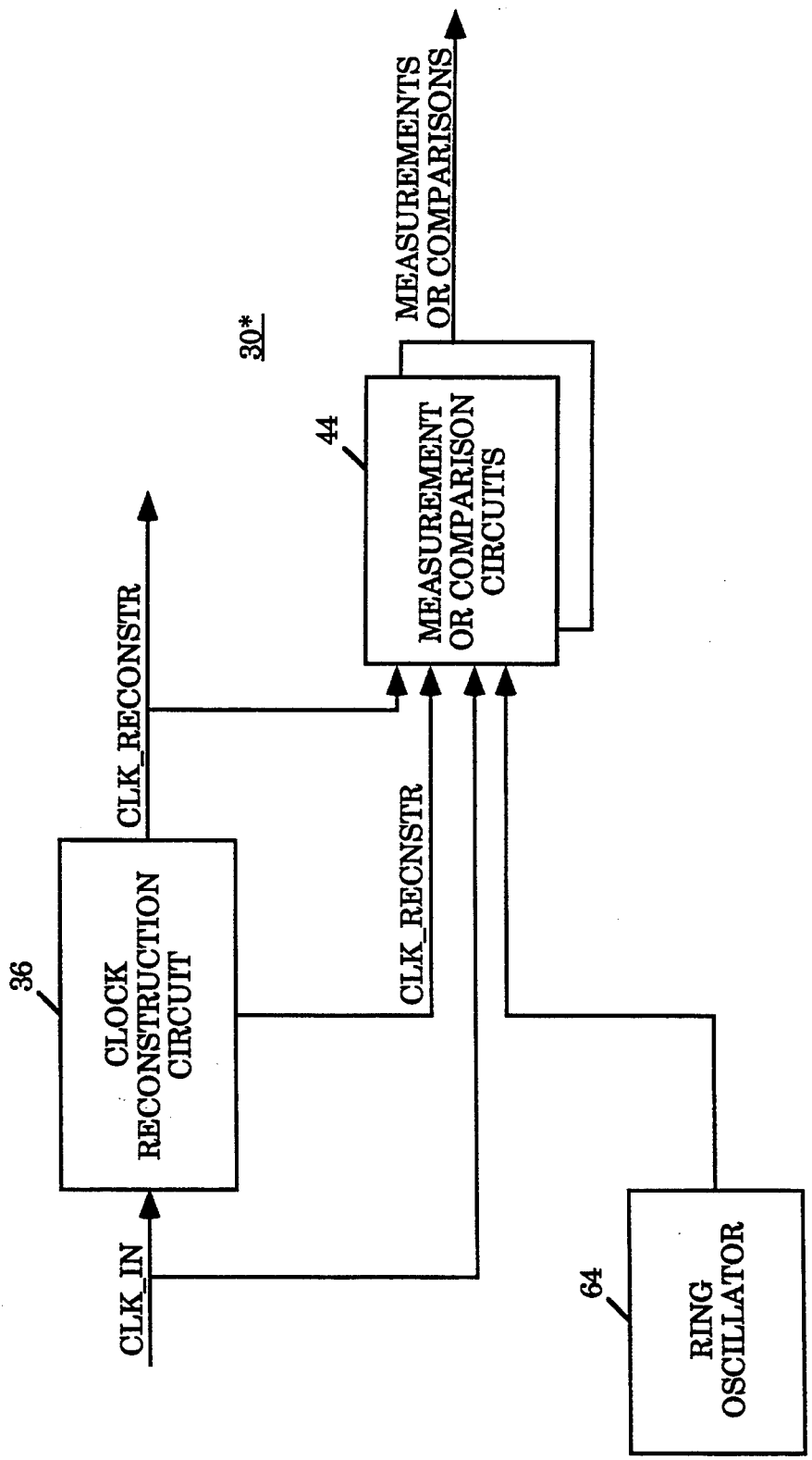
FIG. 3 illustrates the digital clock reconstruction and related circuits of the TARs of FIG. 2.

Referring now to FIG. 3, a block diagram illustrating the digital clock reconstruction and related circuitry provided to each of the TARs of FIG. 2 is shown. As illustrated, each TAR is provided with a digital clock reconstruction circuit 36 and at a minimum, a measurement or a comparison circuit 44. Preferably, for improved reliability, multiple measurement or comparison circuits 44 are provided, and for improved useability, a ring oscillator 64 is also provided. As described earlier, the measurement or comparison circuits 44 comprise the frequency and high/low time measuring circuit of the present invention. The digital clock reconstruction circuit 36 is used to generate a first reconstructed clock (CLK_RECNSTR), and preferably a second reconstructed clock (CLK_RECNSTR') based on the entering clock (CLK_IN). When calibrated, CLK_RECNSTR corrects the digital skew of CLK_I N and meets the minimum high and low time requirement of the TAR regardless of the ultimate operating speed. CLK_RECNSTR' is used as a basis during normal operation for providing early warning to the fact that the period of CLK_RECNSTR is starting to drift away 50% duty cycle symmetry. The measurement or comparison circuits 44 are used to selectively measure the frequencies of CLK_RECNSTR and CLK_RECNSTR' or compare them to the frequency of CLK_IN during calibration and normal operation of the digital clock reconstruction circuit 36. The frequency and high/low time measuring circuit of the present invention is used during both calibration and normal operation of the digital clock reconstruction circuit 36. The ring oscillator 64 is used to generate a number of ring signals during calibration. For further descriptions of the digital clock reconstruction circuit 36, other measurement and comparison circuits 44, the ring oscillator 64, the difference between CLK_RECNSTR and CLK_RECNSTR', the calibration process, and monitoring during normal operation, see copending U.S. patent applications, Ser. No. 08/040,424, filed Mar. 31, 1993, entitled Method and Apparatus For Digitally Compensating Digital Clock Skew For High Speed Digital Circuits, and Ser. No. 08/040,477, filed Mar. 31, 1993 entitled Method and Apparatus For Testing Frequency Symmetry of Digital Signals, both assigned to the assignee of the present invention, and fully incorporated by reference herein.

Figure 4:
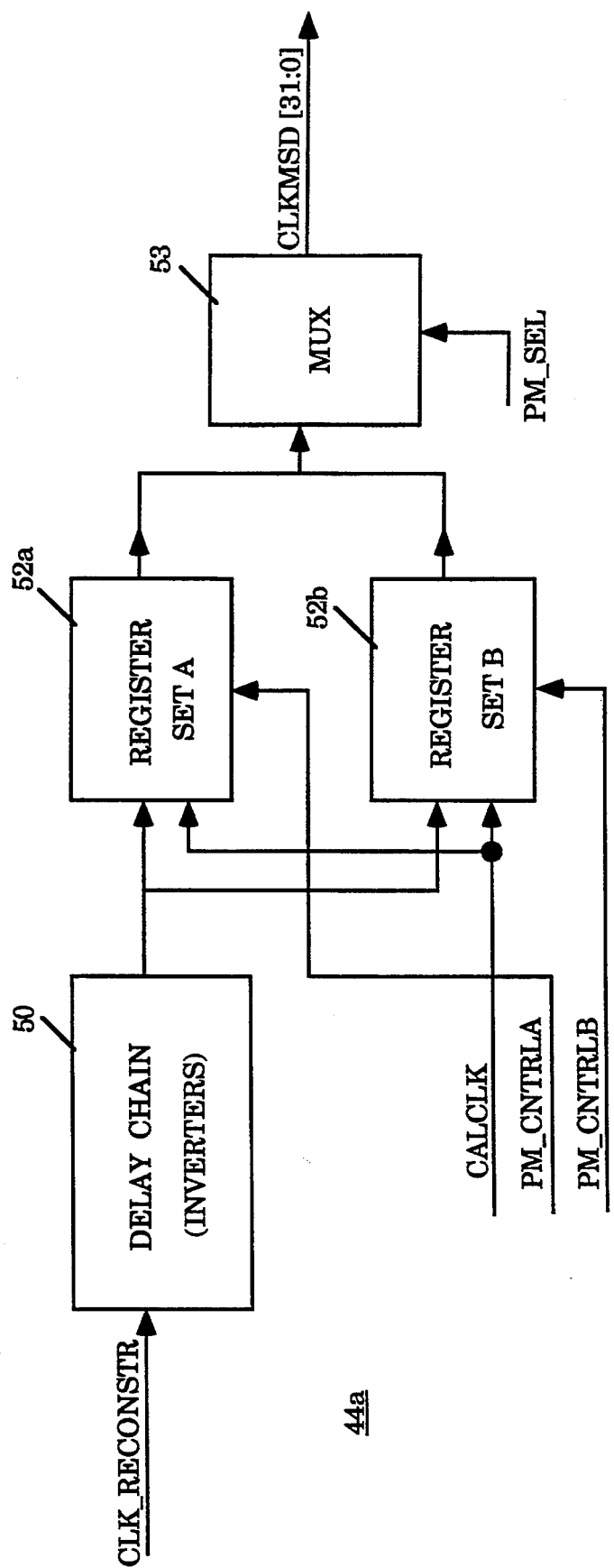
FIG. 4 illustrates one embodiment of the frequency and high/low time measuring circuit of the present invention.
Figure 5A:
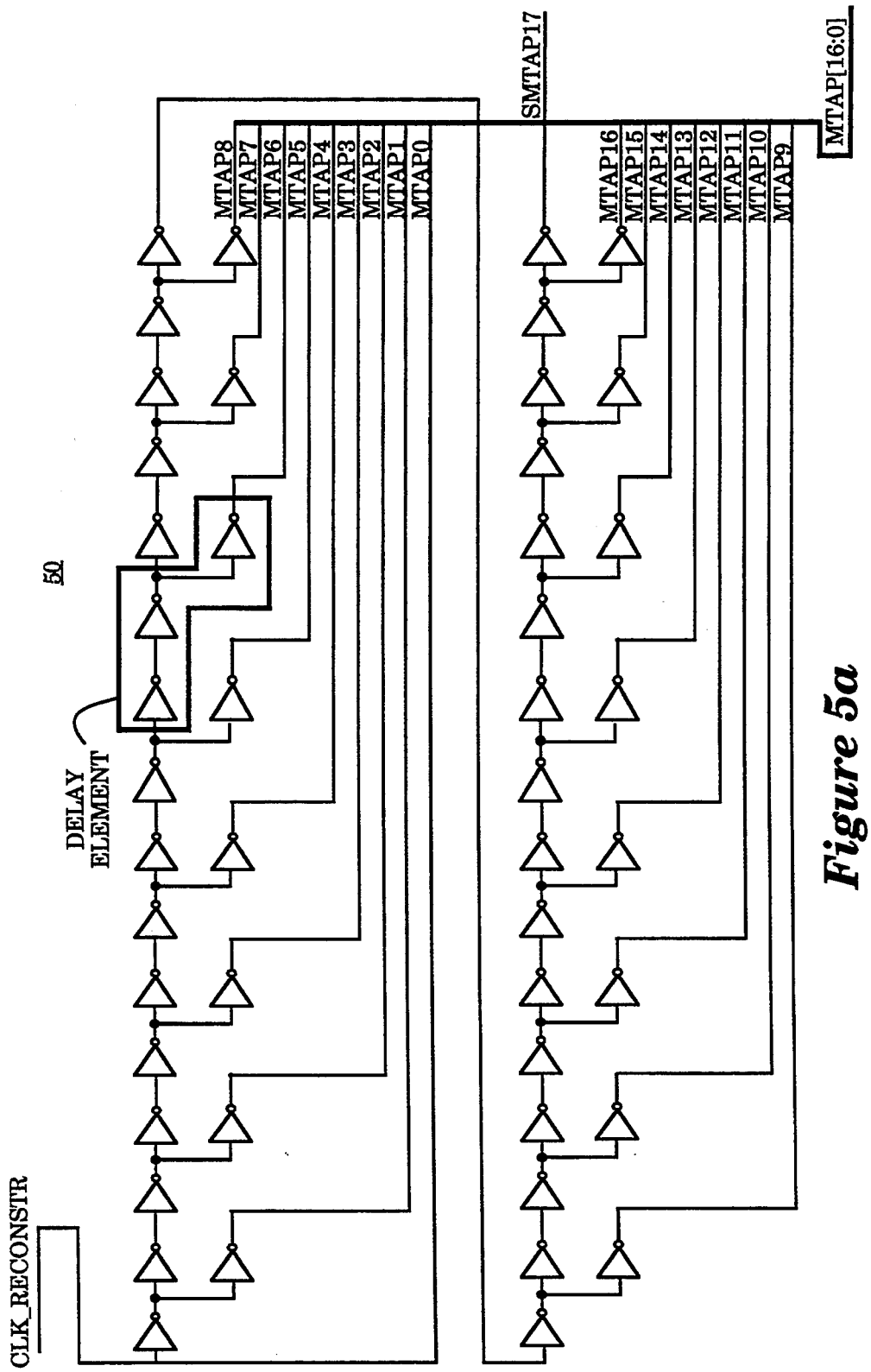
FIGS. 5a-5d illustrate one embodiment of the delay chain of FIG. 4 in further detail.
Figure 5B:
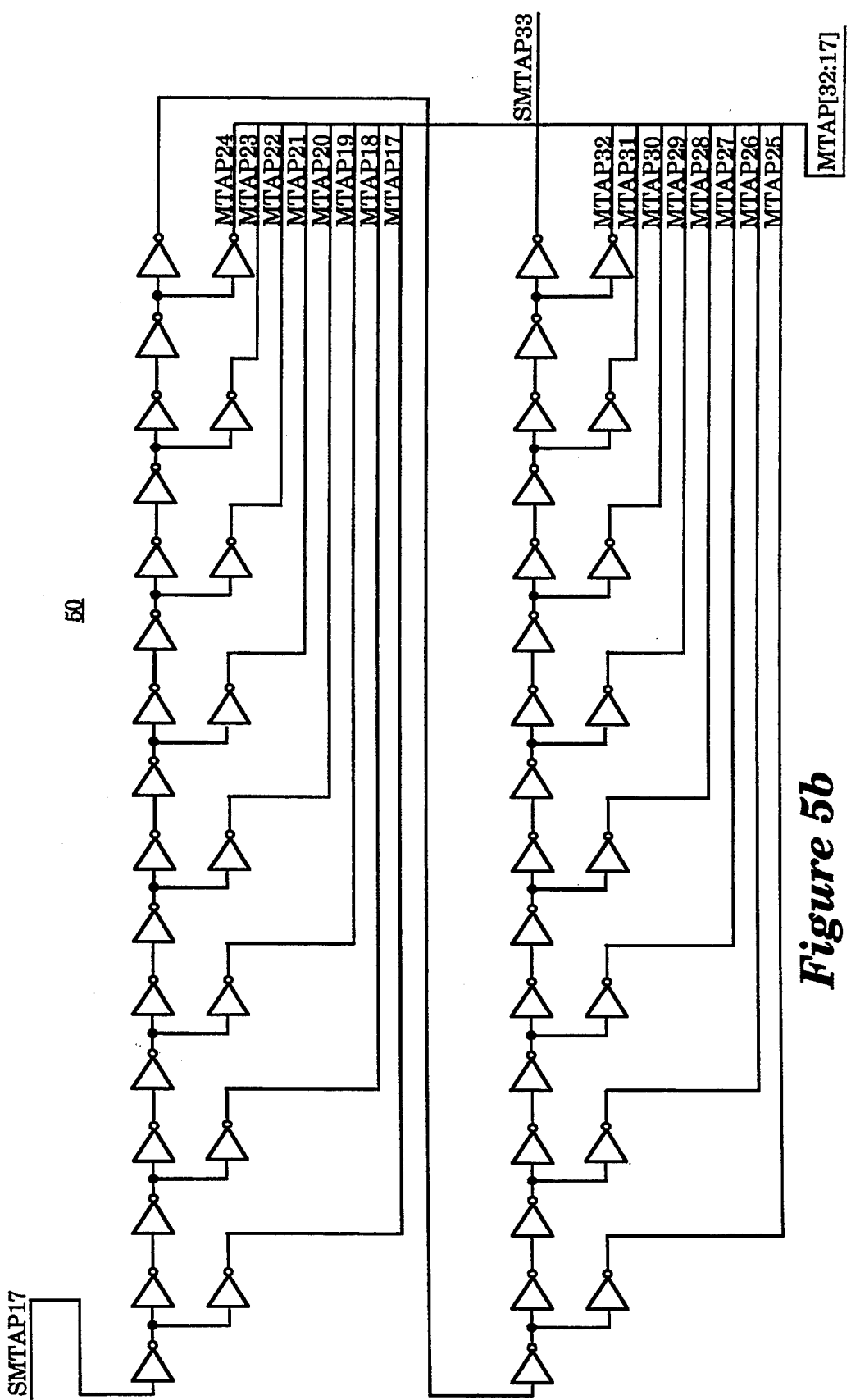
Figure 5C:
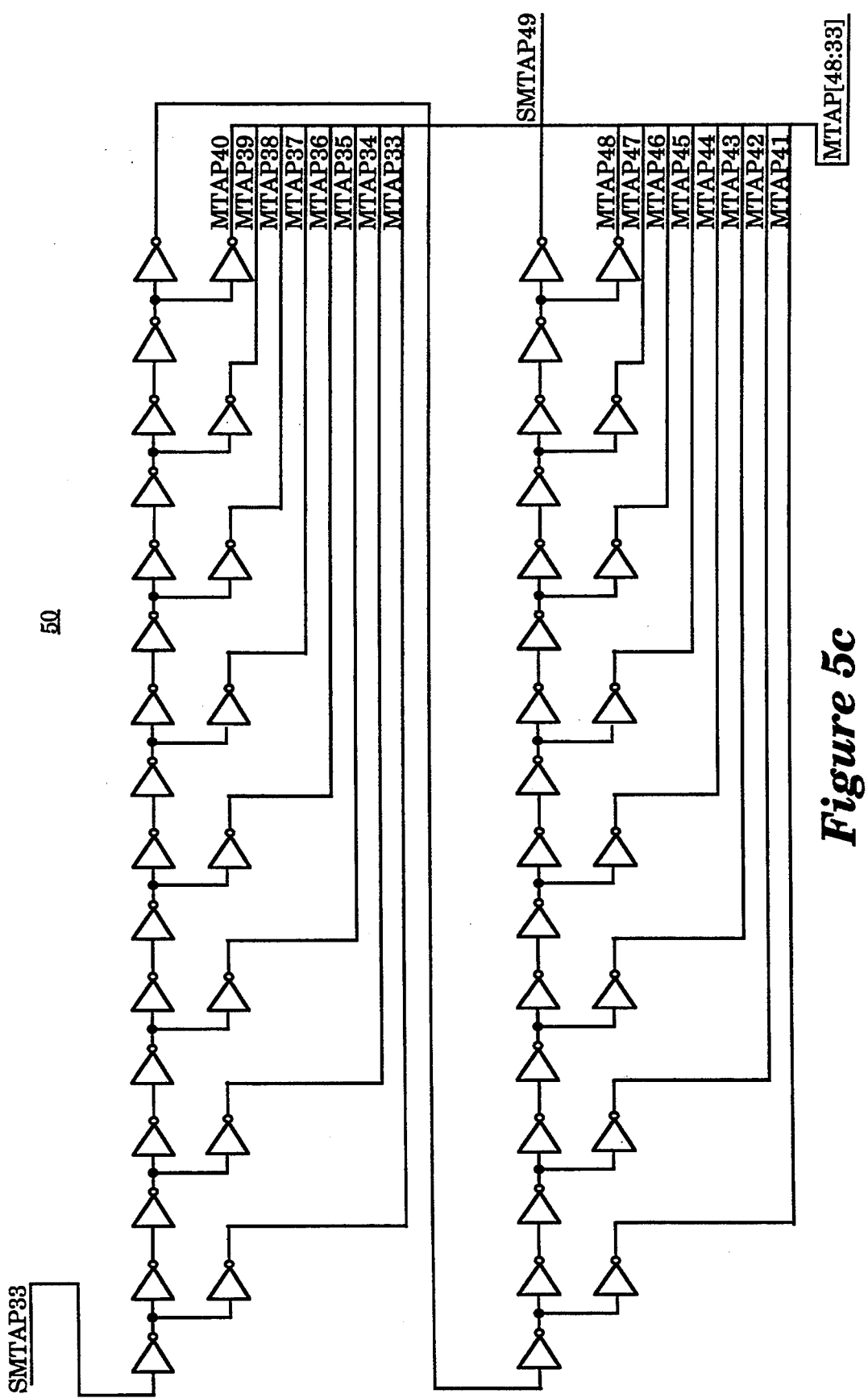
Figure 5D:
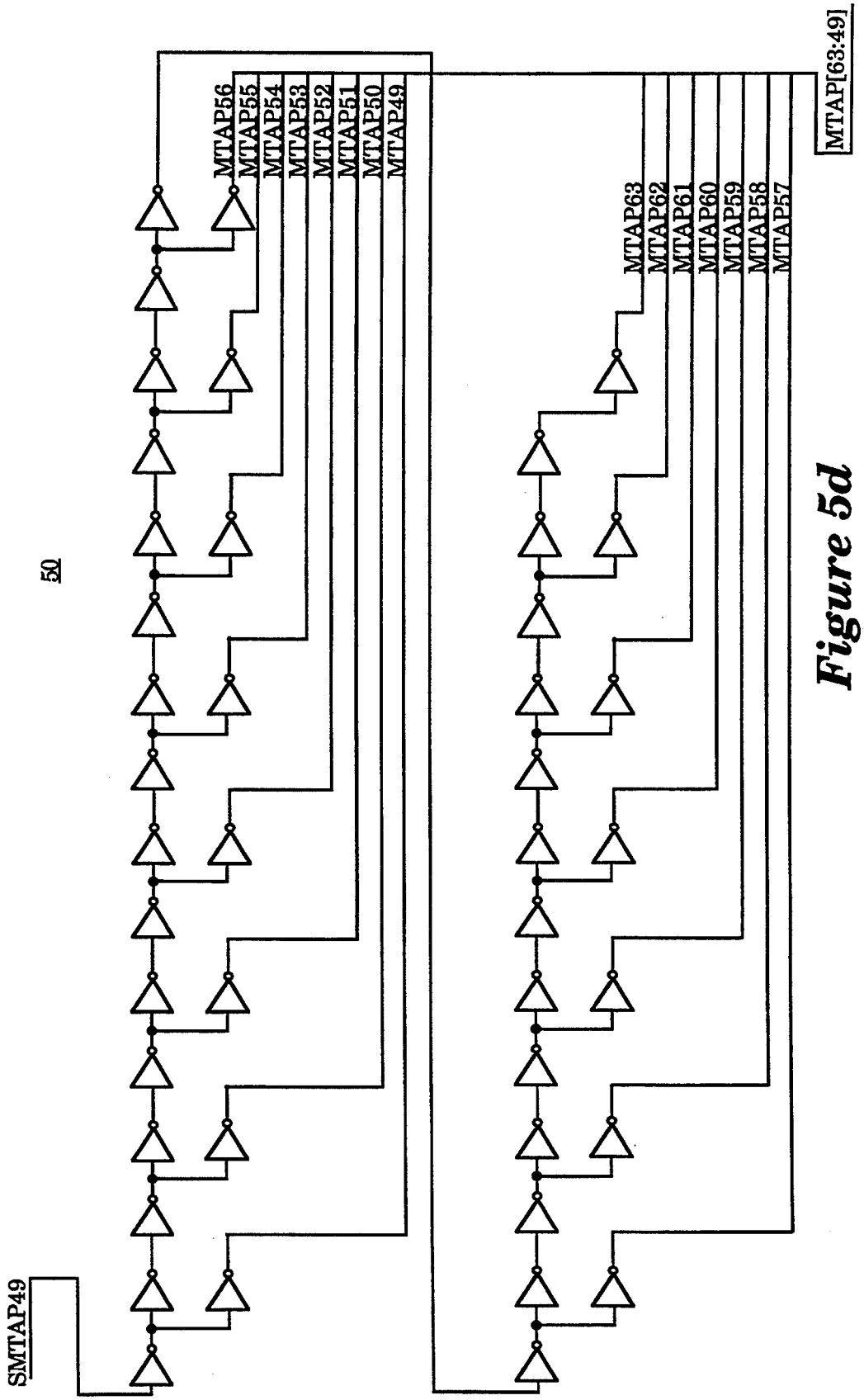

Referring now to FIG. 4, a block diagram illustrating one embodiment of the frequency and high/low time measuring circuit of the present invention is shown. In this embodiment, the frequency and high/low time measuring circuit 44a comprises a delay chain 50, a first and a second register sets 52a and 52b, and, preferably an array of multiplexors 53. The delay chain 50 is coupled to the first and second register sets 52a and 52b, which in turn are coupled to the multiplexors 53. The delay chain 50 receives the reconstructed clock as input, and in response, generates a number of delayed outputs of the reconstructed clock. The first and second register sets 52a and 52b receive the various delayed outputs as inputs, one output per register bit of the register sets. The delayed outputs are sampled successively at the beginning and end of a predetermined time period, and the sample results stored into the two register sets 52a and 52b. The sample results are read out from the register sets 52a and 52b through the multiplexors 53, and used to determine the frequency of the digital signal and the high/low time of its clock period. The amount of time represented by each bit is first determined based on the bit shifting between the first and the second samples, which were taken with a predetermined time differential. Once the amount of time represented by each bit is known, the clock period of the digital signal is determined based on the length of a run of contiguous one bits followed by contiguous zero bits. Once the clock period is known, the frequency o the digital signal can be computed. The high and low times of a clock period are computed from the length of the contiguous one bits, and the contiguous zero bits respectively. How the frequency of the digital signal and the high/low time of its clock period are determined from the sample results will be illustrated further with an exemplary measurement below. Preferably, the first and second register sets 52a and 52b are also equipped to receive as alternate input, an unreconstructed calibrated clock (CALCLK in FIG. 4 or by passed CLK_IN of FIG. 3), bypassing the delay chain 50, for the purpose of validating the operation of the frequency and high/low time measuring circuit 44a.

Referring now to FIGS. 5a-5d, four diagrams illustrating one embodiment of the delay chain of FIG. 4 in further detail is shown. In this embodiment, the delay chain 50 comprises a number of delay elements serially coupled to each other. Each delay element comprises two inverters and a buffering inverter receiving one input and generating two outputs. Together, they generate 64 delayed outputs of the reconstructed clock, and the amount of delays applied between any two outputs are approximately the same. For example, MTAP0 is taken at a point where the reconstructed digital clock has travelled through 2 inverters and 1 buffering inverter, MTAP1 is taken at a point where the reconstructed digital clock has travelled through an additional 2 inverters and an additional buffering inverter, and so forth. While the present invention is being described with delay elements comprising inverters, it will be appreciated that the present invention may be practiced with other delay elements.

Figure 6B:
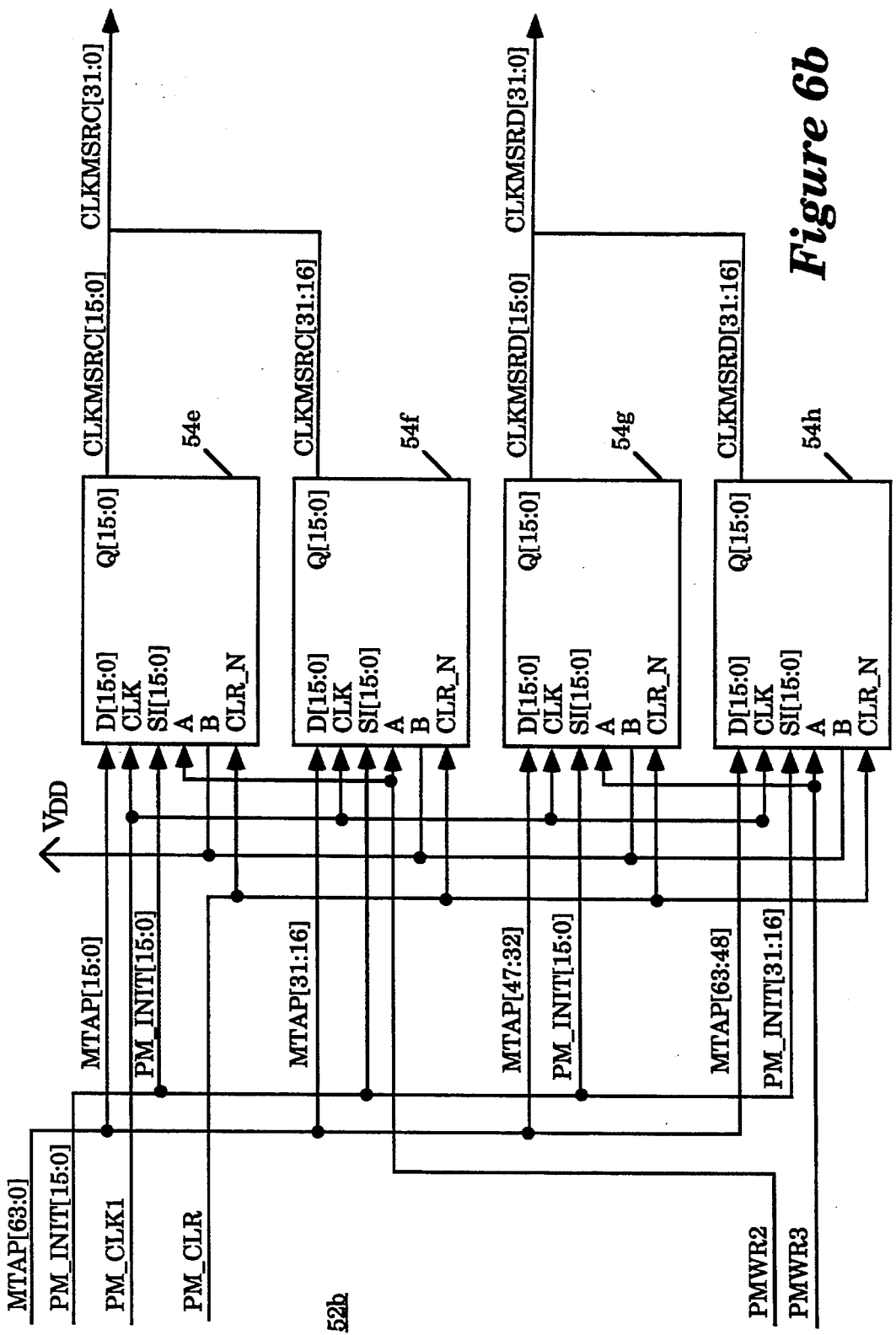
Figure 7A:
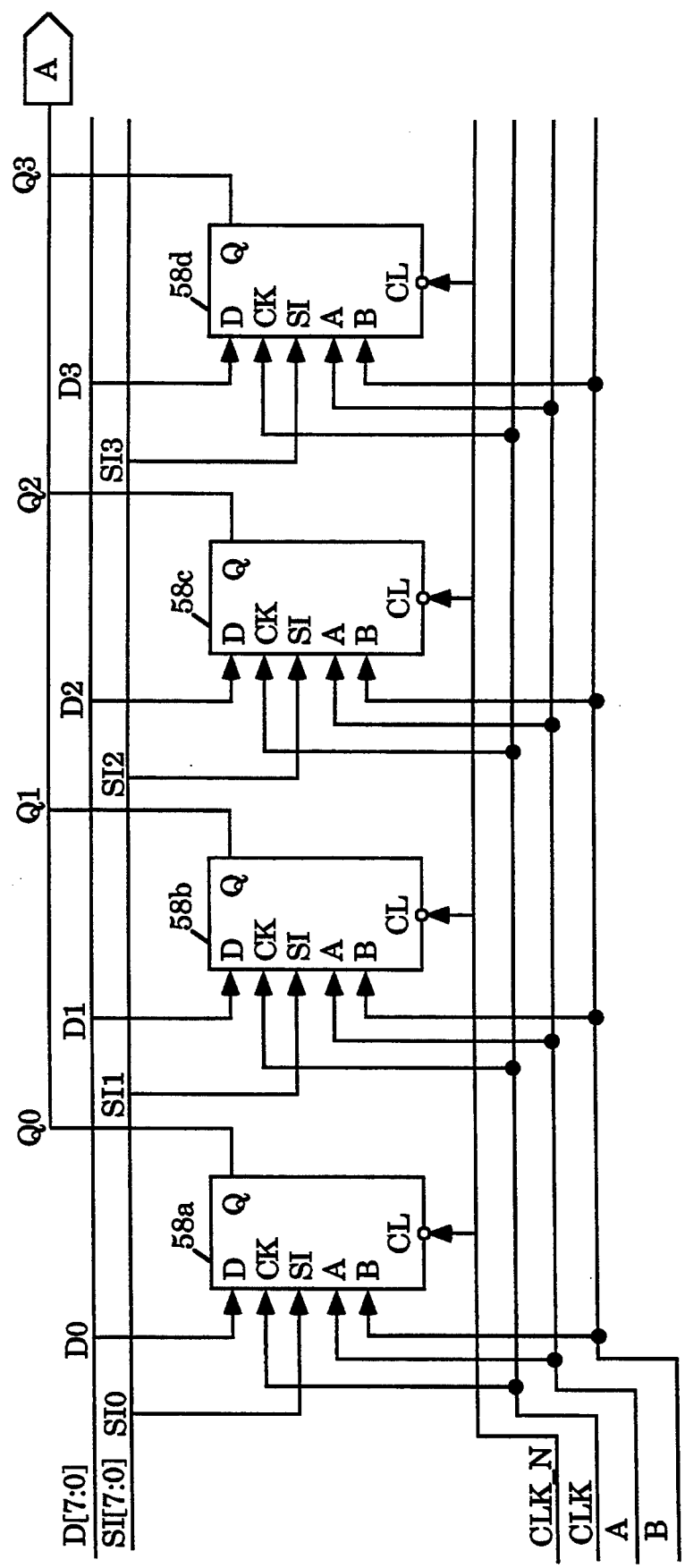
FIGS. 7a-7d illustrate one embodiment of: the registers of FIGS. 6a and 6b in further detail.
Figure 7B:
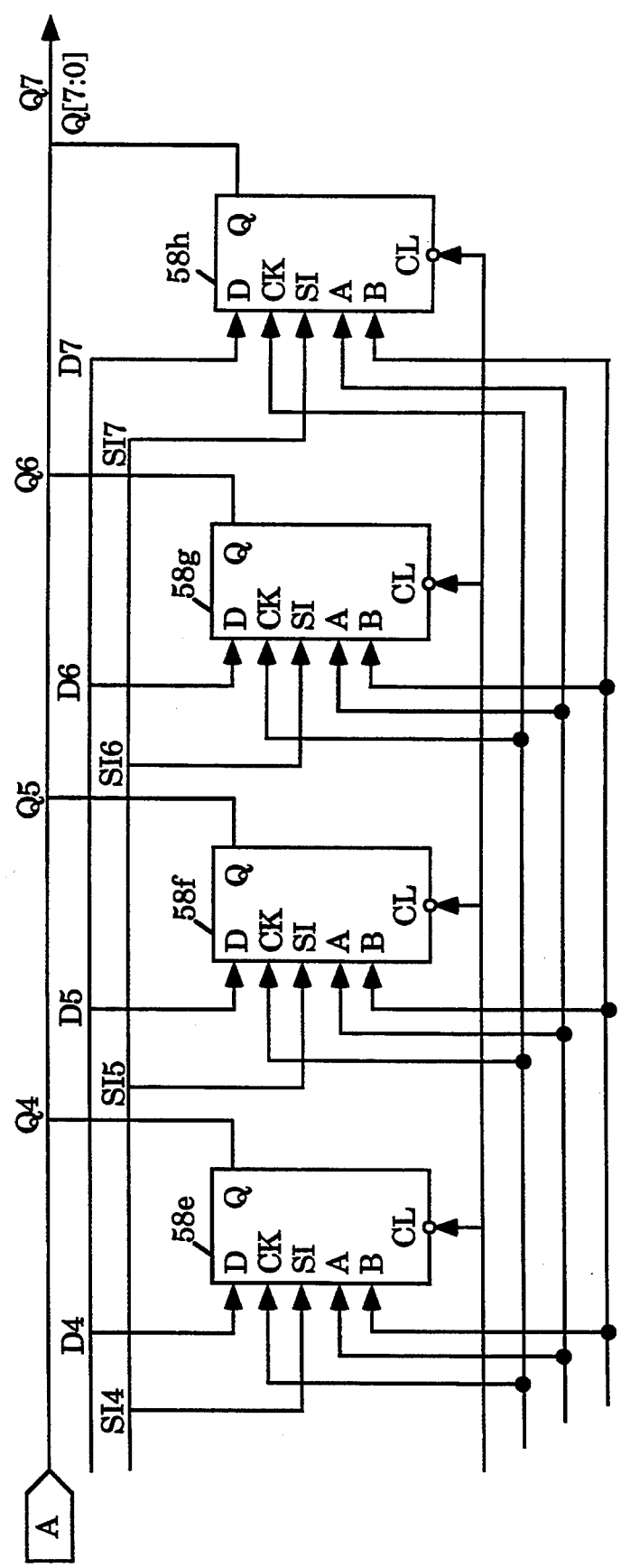
Figure 7C:
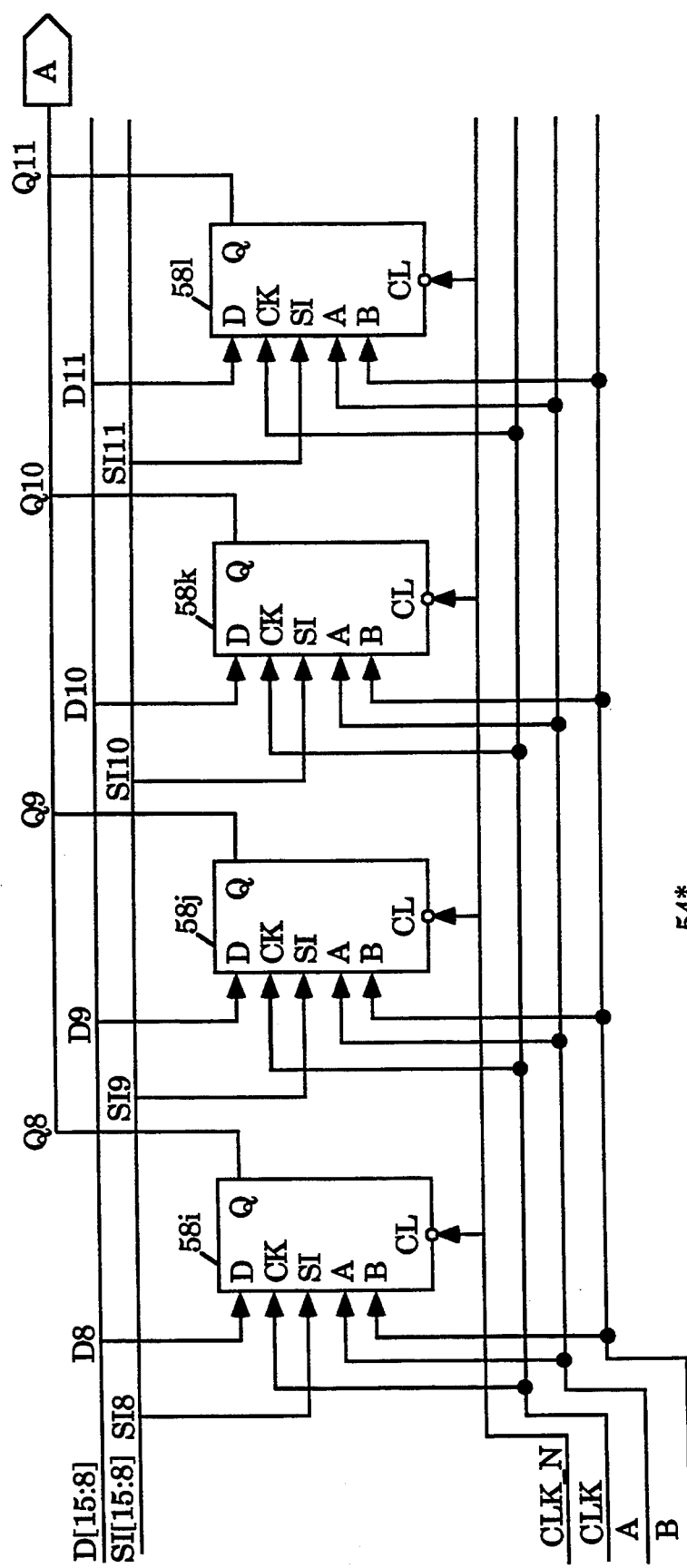
Figure 7D:
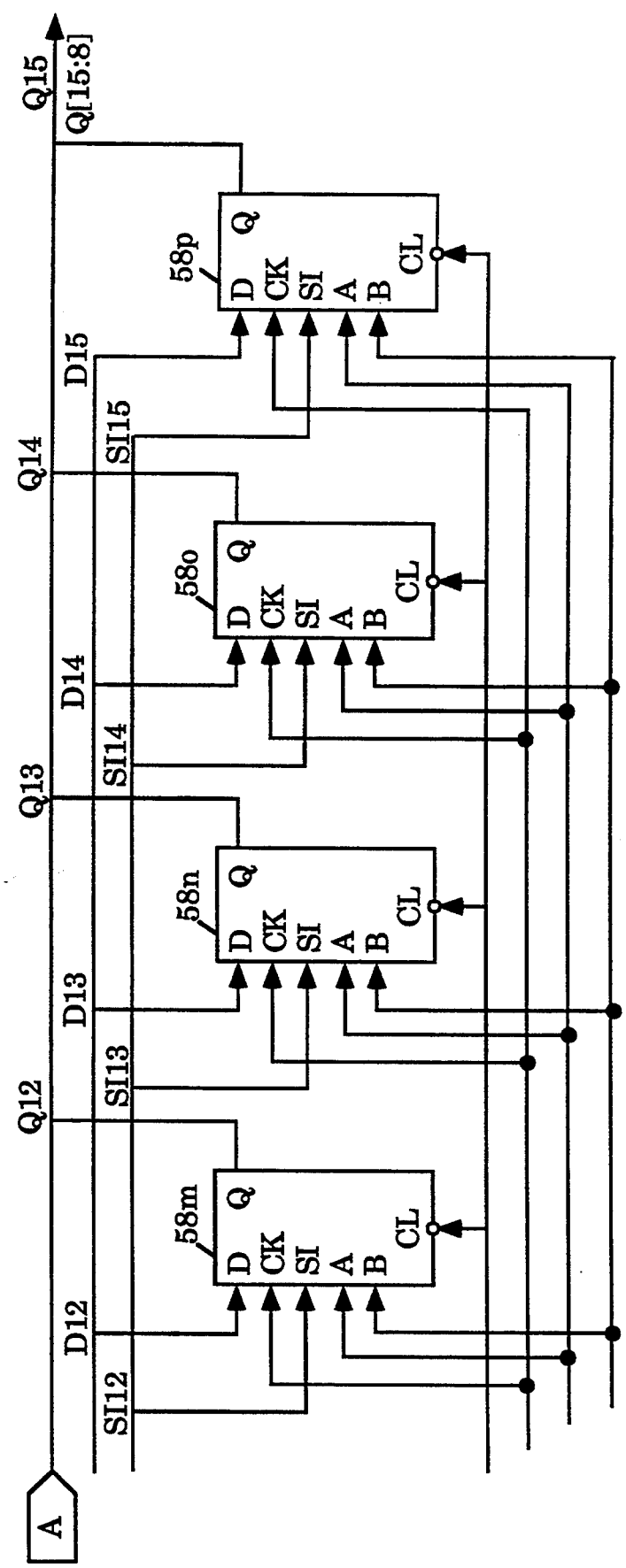
Figure 8A:
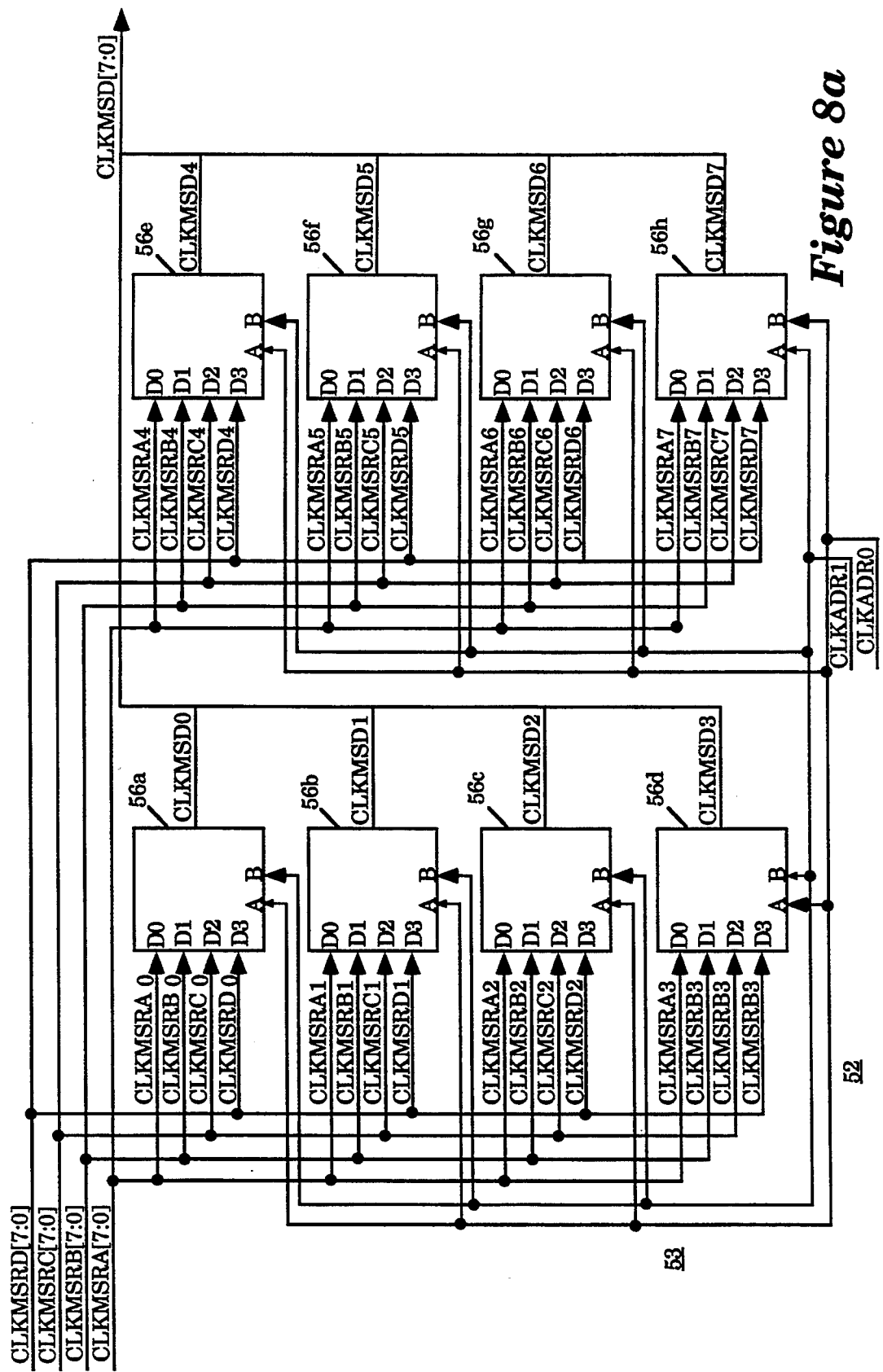
FIGS. 8a-8d illustrate one embodiment of the multiplexor array of FIG. 4 in further detail.
Figure 8B:
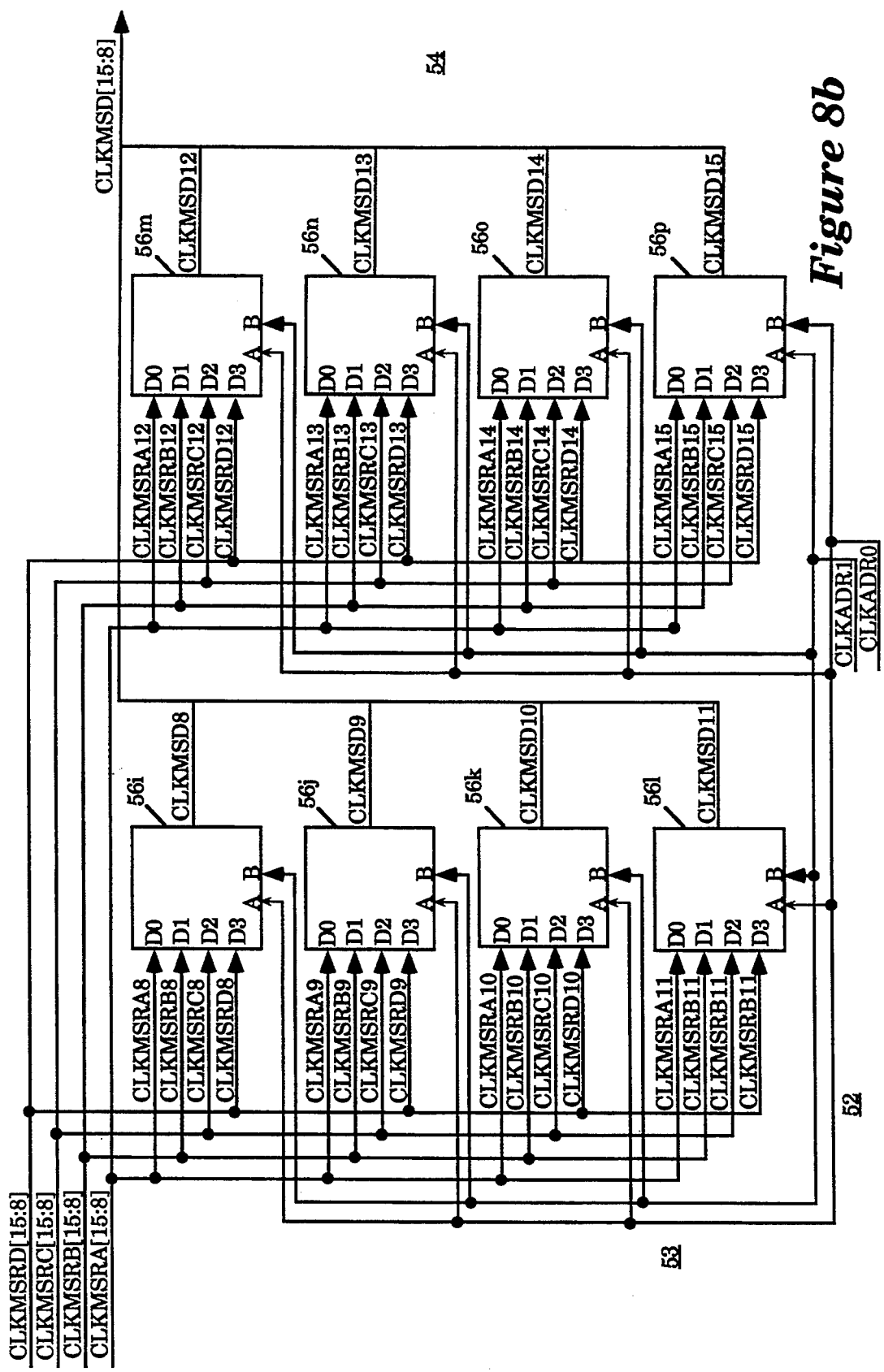
Figure 8C:
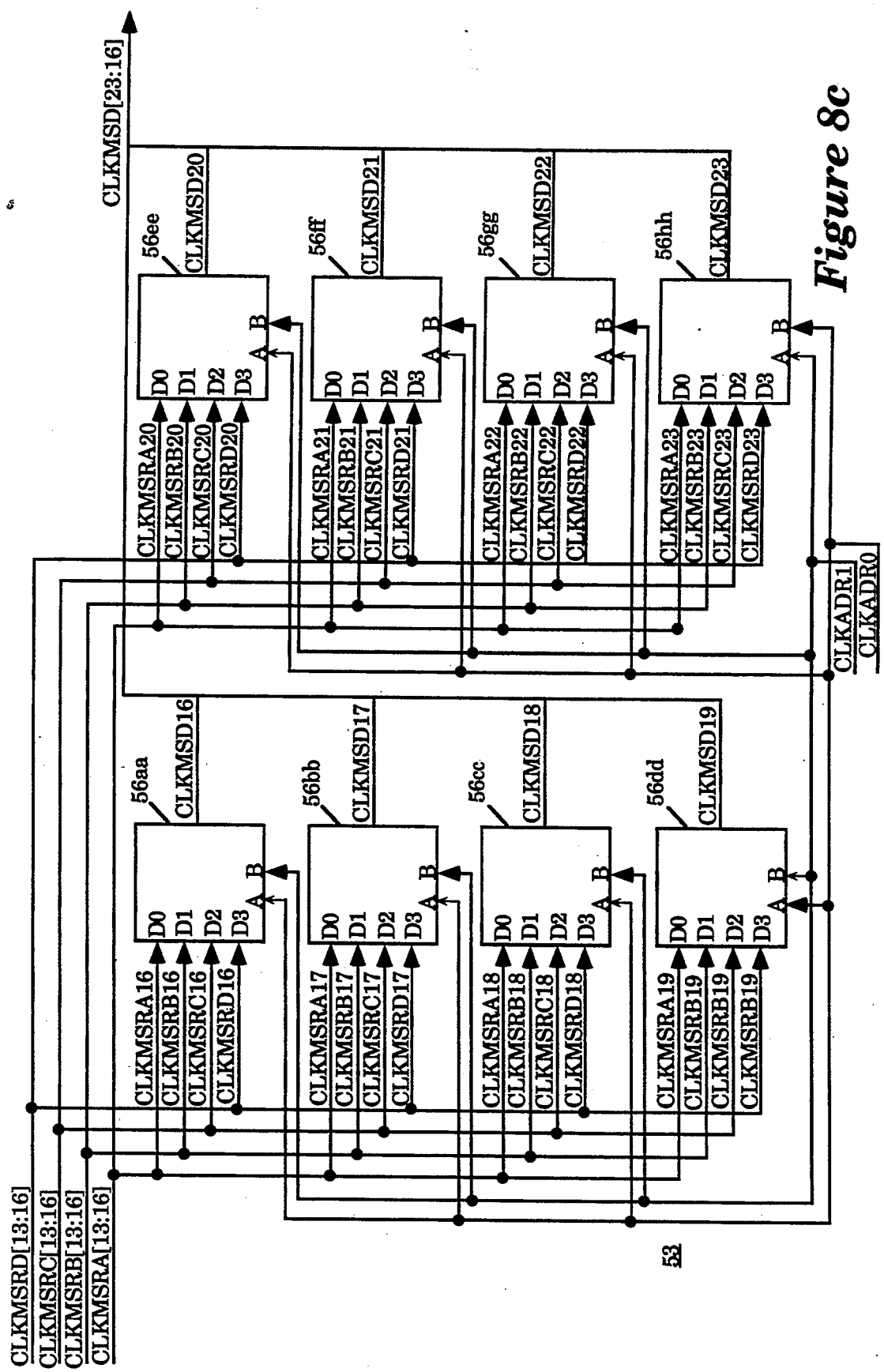
Figure 8D:
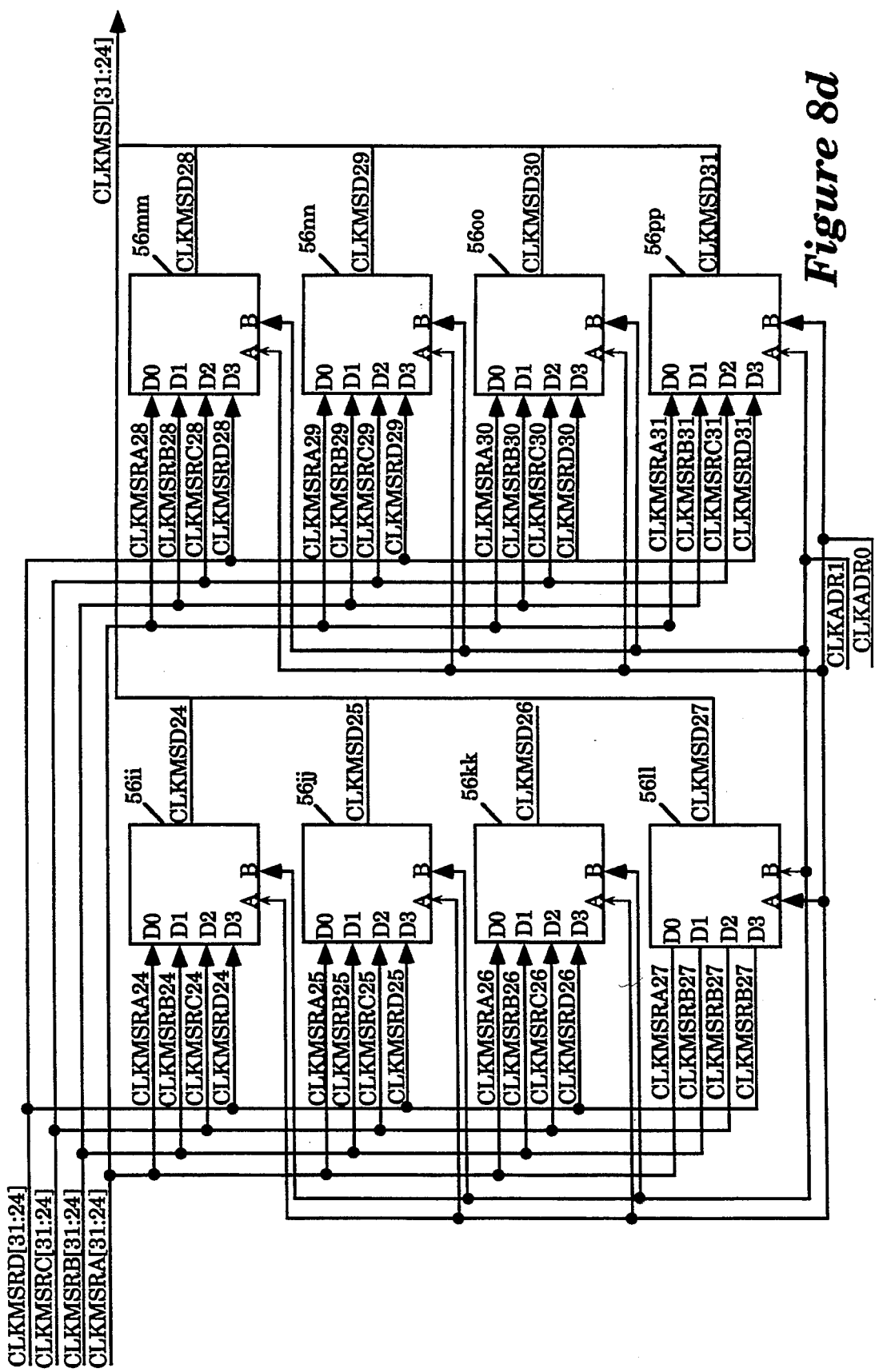

Referring now to FIGS. 6a-6b, two block diagrams illustrating one embodiment of the two register sets of FIG. 4 in further detail are shown. In this embodiment, each register set 52a or 52b comprises four 16 bit registers 54a-54d, or 54e-54h, receiving 16 of the 64 outputs of the delay chain. The registers 54a-54d and 54e-54h, and their register bits correspond to each other. For example, the first register 54a or 54e of each register set 52a or 52b receives the first 16 of the 64 outputs, MTAP[15:0], the second register 54b or 54f of each register set 52a or 52b receives the second 16 of the 64 outputs, MTAP[31:16], and so forth.

Referring now to FIGS. 7a-7d, two diagrams illustrating one embodiment of the registers of FIGS. 6a-6d in further detail are shown. In this embodiment, each 16 bit register 54* comprises two rows of 8 flip flops 58a-58h and 58i-58p. The various outputs from the delay chain are clocked into the flip flops 58a-58p through the D inputs, and in turn they are clocked out of the flip flops 58a-58p through the Q outputs.

Referring now to FIGS. 8a-8d, four block diagrams illustrating one embodiment of the multiplexor array of FIG. 4 in further details are shown. In this embodiment, the multiplexor array 53 comprises of 32 multiplexors 56a- 56pp. Each multiplexor 56* is coupled to four registers, two in each register set, receiving 4 register bits and selectively outputting 1 of the 4 register bits received. For example, the multiplexor 56a receives the first bit of the first and third registers of the first and second register sets, the multiplexor 56b receives the second bit of the first and third registers of the first and second register sets, and so forth.

Figure 9:
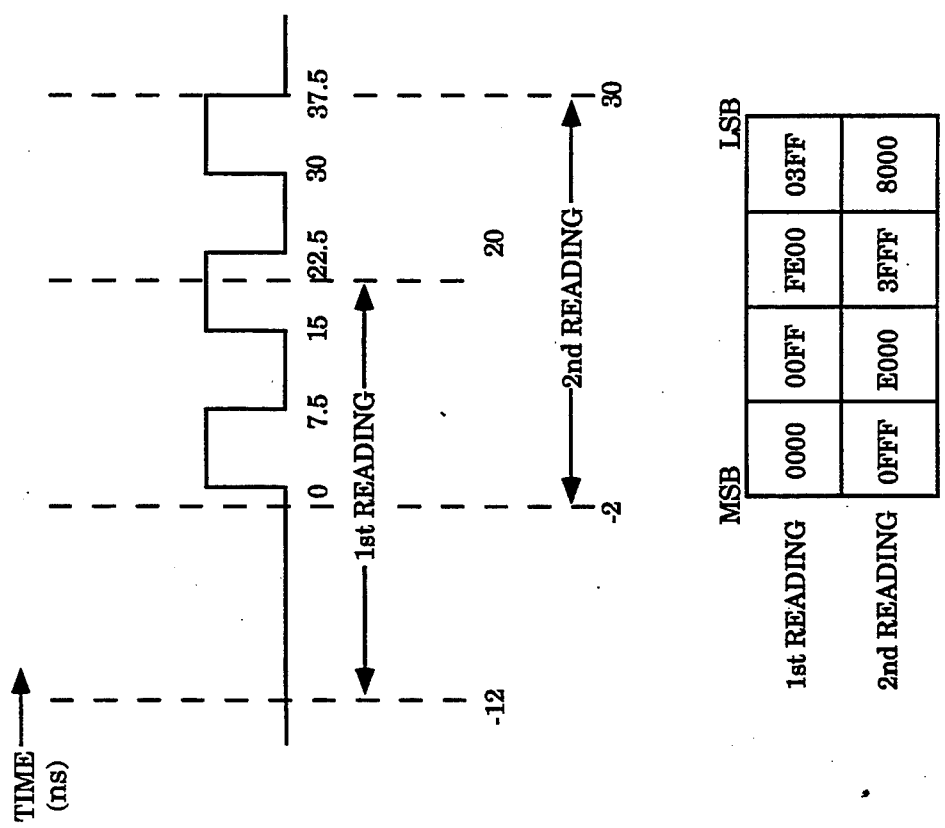
FIG. 9 illustrates an exemplary measurement under the present invention.

Referring now to FIG. 9, a diagram illustrating an exemplary measurement under the present invention is shown. Shown is approximately 40 ns of an exemplary reconstructed clock having a reconstructed period of 15 ns. The first sample of the delayed outputs is taken at about 20 ns, and the second sample is taken at 10 ns later, at about 30 ns. For the purpose of this exemplary measurement, the 10 ns period is generated from a known source (in this case, CALCLK). It will be appreciated that other time periods between samples may be used, preferably they are less than ½ of the delay provided by the delay chain. Assuming each delay element provides about 0.5 ns of delay (an unknown quantity), the first sample took a snap shot of the reconstructed clock between −12 ns and 20 ns, whereas, the second sample took a snap shot of the reconstructed clock between −2 ns and 30 ns. Thus, as illustrated, the first and second sample results are "0000 00FF FE00 03FF" and "0FFF E000 3FFF 8000". Therefore, based on the fact that the pattern "3FF" or "FFFE" has shifted 20 bits in 10 ns, it can be inferred that each bit corresponds to 0.5 ns. In other words, each delay element provides 0.5 ns of delay. Additionally, from the consecutive one bits and consecutive zero bits, such as "FFFE 0003", it can be inferred that both the high as well low time of the reconstructed clock period are 7.5 ns. Therefore, it can be inferred from the high and low time that the reconstructed clock period is 15 ns. It follows then the frequency of the reconstructed clock is 66 MHZ.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a digital system comprising a periodic digital signal, an apparatus for determining the periodic digital signal's frequency and the period's high and low time of the periodic digital signal low time, said apparatus comprising:
   a) delay means comprising a plurality of delay elements for receiving said periodic digital signal applying a plurality of delays to the received periodic digital signal, and generating a plurality of delayed outputs of said digital signal, each of said delay elements applying an equal amount of delay to the received periodic digital signal; and
   b) register means coupled to said delay means comprising a first register and a second register for receiving and storing a first and a first sample and a second sample of said delayed outputs taken at a beginning and an end of a predetermined time period, each of said first register and said second register having a plurality of bits corresponding to said plurality of delay elements, the first and second samples being used to determine the frequency of said periodic digital signal the high time of the period of the periodic digital signal, and the low time of the period of the periodic digital signal individually or in combination with each other.

2. The apparatus as set forth in claim 1, wherein, each of said delay elements comprises a plurality of inverters.

3. The apparatus as set forth in claim 1, wherein, the frequency of said periodic digital signal and the high and low times of the period of the periodic digital signal are determined by
   i) determining the amount of delay applied by each delay element based on the number of bits a bit pattern has shifted between the first and second samples;

ii) determining the high and low time of the periodic digital signal's period based on the number of consecutive one bits in a one bit run and the number of consecutive zero bits in a zero bit run, and the determined amount of delay applied by each delay element; and iii) determining the frequency of said periodic digital signal based on the sum of determined high and low time of said periodic digital signal.

4. The apparatus as set forth in claim 1, wherein, said apparatus further comprises c) multiplexor means coupled to said register means for selectively reading one of the said stored first and second samples.

5. In a digital system comprising a periodic digital signal, a method for determining the periodic digital signal's frequency and the period's high and low time of the periodic digital signal said method comprising the steps of:

a) receiving said periodic digital signal, applying a plurality of delays to the received periodic digital signal, and generating a plurality of delayed outputs of said digital signal, each of said delayed outputs having an equal amount of incremental delay applied thereto;

b) receiving and storing a first sample and a second sample of said delayed outputs taken at a beginning and an end of a predetermined time period, each bit of the stored first and second samples corresponding to one of said delayed outputs; and c) retrieving the first and second samples and determining the frequency of said digital signal, the high time of its period, the period of the periodic digital signal, and the low time of the period of the periodic digital signal individually or in combination with each other, using the retrieved first and second samples.

6. The method as set forth in claim 5, wherein, the determination of the frequency of said periodic digital signal and the high and low times of the period of the periodic digital signal in step c) comprises:

i) determining the incremental amount of delay applied between any two delayed outputs based on the number of bits a bit pattern has shifted between the first and second samples;

ii) determining the high and low time of the periodic digital signal's period based on the number of consecutive one bits in a one bit run and the number of consecutive zero bits in a zero bit run, and the determined amount of delay applied by each delay element; and iii) determining the frequency of said periodic digital signal based on the sum of the determined high and low time of said periodic digital signal.

7. In a digital system comprising a periodic digital signal, an apparatus for determining the periodic digital signal's frequency and the period's high and low time of the periodic digital signal said apparatus comprising:

a) a delay chain comprising a plurality of delay elements for receiving said periodic digital signal, applying a plurality of delays to the received periodic digital signal, and generating a plurality of delayed outputs of said periodic digital signal, each of said delay elements applying an equal amount of delay to the received periodic digital signal; and b) a set of register coupled to said delay chain comprising a first register and a second register for receiving and storing a first sample and a second sample of said delayed outputs taken at a beginning and an end of a predetermined time period, each of said first register and said second register having a plurality of bits corresponding to said plurality of delay elements, the first and second samples being used to determine the frequency of said periodic digital signal, the high time of the period of the periodic digital signal, and the low time of the period of the periodic digital signal individually or in combination with each other.

8. The apparatus as set forth in claim 7, wherein, each of said delay elements comprises a plurality of inverters.

9. The apparatus as set forth in claim 7, wherein, the frequency of said periodic digital signal and the high and low time of the period of the periodic digital signal are determined by i) determining the amount of delay applied by each delay element based on the number of bits a bit pattern has shifted between the first and second samples;

ii) determining the high and low time of the periodic digital signal's period based on the number of consecutive one bits in a one bit run and the number of consecutive zero bits in a zero bit run, and the determined amount of delay applied by each delay element; and iii) determining the frequency of said periodic digital signal based on the sum of the determined high and low time of said periodic digital signal.

10. The apparatus as set forth in claim 7, wherein, said apparatus further comprises c) a multiplexor coupled to said set of registers to selectively reading one of the stored first and second samples 11. The apparatus as set forth in claim 7, wherein, said digital system is an data instrumentation system; said periodic digital signal is a reconstructed clock generated by a digit clock reconstruction circuit of a high speed trace and recognition circuit of said data instrumentation system, using an entering digital clock originated from a probe of said data instrumentation system.

12. An improved data instrumentation system, the improvement comprising:

a) an improved trace and recognition circuitry having a digital clock reconstruction circuit receiving an entering digital clock from a probe of said improved data instrumentation system, and generating a reconstructed digital clock from said entering digital clock, said improved trace and recognition circuitry further having a frequency and high and low time measuring circuit for measuring frequency of said reconstructed digital clock high time of the reconstructed digital clock's period, and the low time of the reconstructed digital clock's period individually or in combination with each other, said frequency and high and low time measuring circuit having, a.1) a delay chain comprising a plurality of delay elements for receiving said reconstructed digital clock applying a plurality of delays to the received reconstructed digital clock, and generating a plurality of delayed outputs of said reconstructed clock, each of said delay elements applying an equal amount of delay to the received reconstructed digital clock; and a.2) a set of registers coupled to said delay chain comprising a first register and a second register for receiving and storing a first sample and a second sample of said delayed outputs taken at a beginning and an end of a predetermined time period, each of said first register and said second register having a plurality of bits corresponding to said plurality of delay elements, the first and second samples being used to determine the frequency of said reconstructed digital clock the high time of the reconstructed digital clock's period, and the low time of the reconstructed digital clock's period individually or in combination with each other.

* * * * *

UNITED STATES PATENT AND TRADEMARK OFFICE
CERTIFICATE OF CORRECTION

PATENT NO. : 5,440,592

DATED : August 8, 1995

INVENTOR(S) : Ellis et al.

It is certified that error appears in the above-identified patent and that said Letters Patent is hereby corrected as shown below:

In column 2, at line 53, delete "speed" and substitute --speeds--.

In column 3, at line 6, delete "30a14 30d" and substitute --30a-30d--.

In column 6, at line 37 (the fourth line of Claim 1), delete "low time" following "periodic digital signal".

In column 6, at line 40 (the seventh line of Claim 1), insert a comma following "said periodic digital signal".

In column 6, at line 43 (the tenth line of Claim 1), insert --periodic-- between "said" and "digital".

In column 6, at line 48 (the fifteenth line of Claim 1), delete "a first and a first sample" and substitute -- a first sample and a second sample--.

In column 6, at line 55 (the twenty-second line of Claim 1), insert a comma between "digital signal" and "the high".

In column 6, at line 57 (the twenty-fourth line of Claim 1), insert a comma following " digital signal".

In column 7, at line 8, insert --the-- between "sum of" and "determined".

In column 7, at line 13, delete "the said stored" and substitute --the stored--.

In column 7, at line 17, insert a comma between "digital signal" and "said method".

In column 7, at line 22, insert --periodic-- between "said" and "digital signal".

UNITED STATES PATENT AND TRADEMARK OFFICE
CERTIFICATE OF CORRECTION

PATENT NO. : 5,440,592

DATED : August 8, 1995

INVENTOR(S) : Ellis et al.

It is certified that error appears in the above-identified patent and that said Letters Patent is hereby corrected as shown below:

In column 7, at line 31, insert --periodic-- between "said" and "digital signal".

In column 7, at line 32, delete --its period,--.

In column 7, at line 34, insert a comma between "signal" and "individually".

In column 7, at line 57, insert a comma between "signal" and "said".

In column 7, at line 65, delete "register" and substitute --registers--.

In column 8, at line 8, insert a comma between "signal" and "individually".

In column 8, at line 54, insert a comma between "period" and "individually".

In column 8, at line 61, insert --digital-- after "reconstructed".

In column 10, at line 1, insert a comma between "clock" and "the high time".

Signed and Sealed this

Third Day of December, 1996

*Attest:*

BRUCE LEHMAN

*Attesting Officer*   *Commissioner of Patents and Trademarks*